United States Patent [19]

Yamauchi

[11] Patent Number: 5,414,286
[45] Date of Patent: May 9, 1995

[54] NONVOLATILE MEMORY, METHOD OF FABRICATING THE SAME, AND METHOD OF READING INFORMATION FROM THE SAME

[75] Inventor: Yoshimitsu Yamauchi, Yamatokoriyama, Japan

[73] Assignee: Sharp Kabushiki Kaisha, Osaka, Japan

[21] Appl. No.: 33,560

[22] Filed: Mar. 18, 1993

[30] Foreign Application Priority Data

Mar. 19, 1992 [JP] Japan ................................. 4-063867
Mar. 19, 1992 [JP] Japan ................................. 4-063868

[51] Int. Cl.$^6$ ........................................... H01L 29/68
[52] U.S. Cl. ........................................ 257/315; 257/319; 257/401
[58] Field of Search ................ 257/315, 316, 319, 320, 257/401, 758

[56] References Cited

U.S. PATENT DOCUMENTS 5,338,952  8/1994  Yamauchi .......................... 257/315

OTHER PUBLICATIONS

IEDM 91-319, pp. 11.7.1–11.7.4 by Yamauchi et al., Dec. 1991.

Primary Examiner—Mark V. Prenty
Attorney, Agent, or Firm—Nixon & Vanderhye

[57] ABSTRACT

A nonvolatile memory including a plurality of memory cells comprising a semiconductor substrate, a first electrode formed on the substrate, a floating gate formed on the side wall of the first electrode, and a second electrode, wherein the memory cells are arranged in X and Y directions to form a matrix; the first electrodes of memory cells arranged in the Y direction are connected in common in the Y direction, the second electrodes are connected in common in the Y direction; a memory cell and one of its adjacent memory cells arranged in the X direction have a first impurity diffused layer in common; the memory cell and the other adjacent memory thereof have a second impurity diffused layer in common; and the first impurity diffused layers of the memory cells arranged in the X direction are further connected in common by a conductive layer.

12 Claims, 12 Drawing Sheets

Fig. 5 ( g )
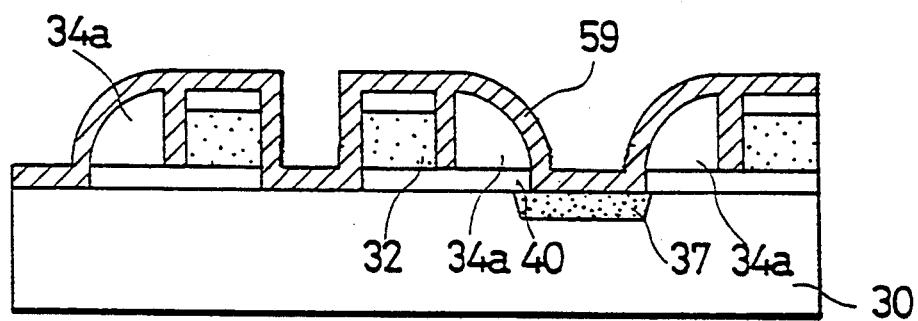
Fig. 5 ( h )
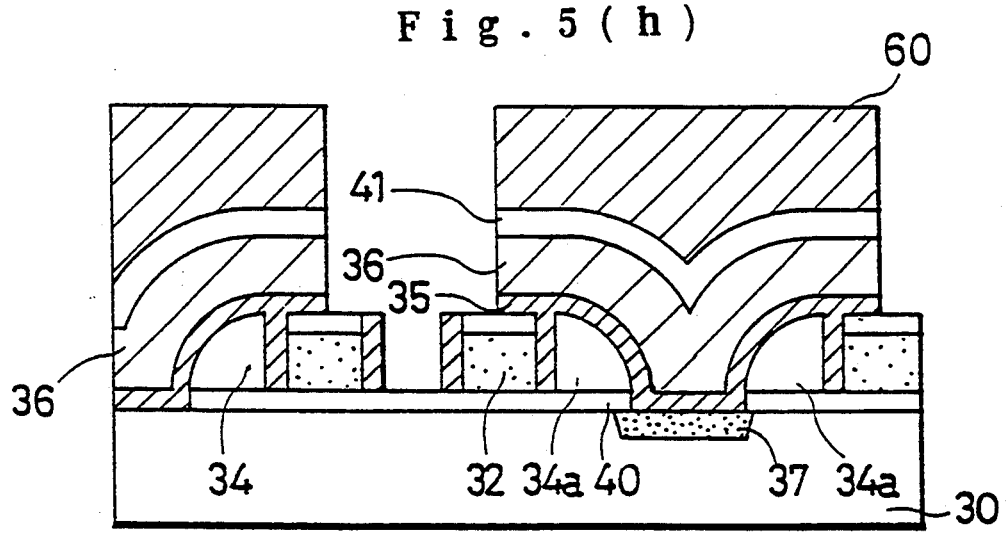

NONVOLATILE MEMORY, METHOD OF FABRICATING THE SAME, AND METHOD OF READING INFORMATION FROM THE SAME

BACKGROUND OF THE INVENTION

1. Field of the Invention

The present invention relates to a high density nonvolatile memory high-density, a fabrication method thereof, and a method of reading data therefrom. More particularly, it relates tea self,alignment-type nonvolatile memory of split structure which is provided with a memory cell array wherein a plurality of memory cells, each having a auxiliary gate, a control gate and a floating gate, are arranged in a matrix and which suitably permits an increase of its capacity.

2. Description of the Prior Art

The unit cell of a nonvolatile memory of split structure is composed of a silicon substrate provided with a source and a drain, a first electrode (AG) formed on the silicon substrate, a floating gate (FG) formed on the side wall of the first electrode, and a second electrode (CG) provided on the floating gate so as to control the potential of the floating gate. These unit cells are arranged in X and Y directions to form a matrix.

FIG. 9 shows two memory cells C11 and C12 arranged in the X direction wherein the source of the memory cell C11 and the drain of the memory cell C12 are continuously formed. Memory cells C21 and C22 are arranged respectively in the Y direction with respect to the memory cells C11 and C12. Memory cells C11 and C21 (C12 and C22) are connected by an impurity diffused layer which functions as a source or a drain without necessitating a contact region for connecting the impurity diffused layer to a metal wiring layer, so that the size of the cell array can be reduced and hence the high-density of the memory device can be realized.

Reading data from a nonvolatile memory of this type has been performed, by, applying predetermined voltages $V_{CG.READ}$, $V_{AG.READ}$, and $V_{D.READ}$ to CG1, AG1, and BL1, respectively, when C11 is a selected cell in FIG. 9. In other words, as shown in FIG. 10, the selected cell, the predetermined voltages $V_{CG.READ}$, $V_{AG.READ}$, and $V_{D.READ}$ are applied to the second electrode (CG) 81, first electrode (AG) 82 and the drain 83, respectively in the selected cell.

However, nonvolatile memories of this arrangement have following disadvantages in reading data therefrom.

When the memory cell C11 is the selected cell in FIG. 9, the second electrode (CG1) is supplied with voltage to be put in the high state as well as the first electrode (AG1) and a bit line BL1 are supplied with voltage to be put in the high state. Then, the first electrode (AG1) and drain of a memory cell C21 which is adjacent in the Y direction are also supplied with voltage to be put in the high state, thereby turning on the AG1 and transistor T21 for the memory cell C21. In this case, if the memory cell C21 is in the state of over erase as shown in FIG. 11, there is a possibility that a leak current, designated by an arrow 91, will flow through the memory cell C21. The second electrode (CG2), the first electrode (AG2), and bit lines BL0 and BL1 in FIG. 9 are in the low state.

When a memory cell C12 (instead of the memory cell C11) is the selected cell, there is also a possibility as mentioned above that a leakage current will flow through the memory cell C22 if the memory cell C22 is in the over-erase state.

Consequently, lacking in the prior art is a memory cell of novel structure for preventing a leakage current from flowing in an unselected cell which is in the same word line as the selected cell and which is in the over-erase state.

SUMMARY OF THE INVENTION

The present invention provides a nonvolatile memory including a plurality of memory cells comprising: a semiconductor substrate provided with a first impurity diffused layer and a second impurity diffused layer; a first electrode formed over the semiconductor substrate; a floating gate formed adjacent the side wall of the first electrode, the floating gate and the first electrode being separated by a sidewall spacer; and a second electrode overlaid at least the floating gate, the second electrode and the floating gate being separated by a spacer, wherein the said memory cells are arranged in X and Y directions to form a matrix; the first electrodes are arranged and in common connected in the Y direction, while the second electrodes are in common connected in the diffused layer by implanting an impurity ion into a region in which the first impurity diffused layer is to be formed, followed by annealing; providing the top surface of the first impurity diffused layer in common; the said memory cell and the other adjacent memory cell thereof have a second impurity diffused layer in common; and the said first impurity diffused layers of the memory cells arranged in the X direction are further connected in common by a conductive layer.

The present invention further provides a method of fabricating a nonvolatile memory comprising the steps of: forming a first electrode on a semiconductor substrate with a gate oxide film interposed therebetween; forming a sidewall spacer from an insulating film on the side wall of the first electrode; forming a tunnel oxide film over the entire top surface of the semiconductor substrate including the first electrode and the sidewall spacer; further forming a floating gate on one side wall of the sidewall spacers formed on both side walls of the first electrode; subsequently implanting an impurity into a region in which a second impurity diffused layer is to be formed by using a resist pattern with an opening for the second impurity diffused layer; forming a first insulating film over the entire top surface of the semiconductor substrate including the first electrode and the floating gate after removal of the resist pattern and simultaneously forming the second impurity diffused layer by annealing; subsequently depositing a polysilicon layer and a second insulating film on the said first insulating film in this order and then forming a second electrode by patterning; forming a first impurity diffused layer by implanting an impurity ion into a region in which the first impurity diffused layer is to be formed, followed by annealing; providing the top surface of the first impurity diffused layer with an opening leading to the semiconductor substrate and simultaneously forming sidewall insulating films on the side walls facing the opening of the first and second electrodes; and forming a conductive layer on the semiconductor substrate including the first and second electrodes and connecting the first impurity diffused layers of memory cells arranged in the X direction by etching the conductive layer with the use of a mask.

The present invention still further provides a method of reading data from the above nonvolatile memory including a plurality of memory cells, whereby data is read from a desired selected memory cell, when a high voltage is applied to the first electrode of an unselected memory cell which has the first electrode in common with a selected memory cell from which data is to be read, by equating the potentials of the first and second impurity diffused layers of the unselected memory cell.

BRIEF DESCRIPTION OF THE DRAWINGS

FIGS. 5(a)-5(k) are a cross-sectional views schematically showing the fabrication process of the nonvolatile memory of the present invention;

DETAILED DESCRIPTION OF THE PREFERRED EMBODIMENT

Figure 1:
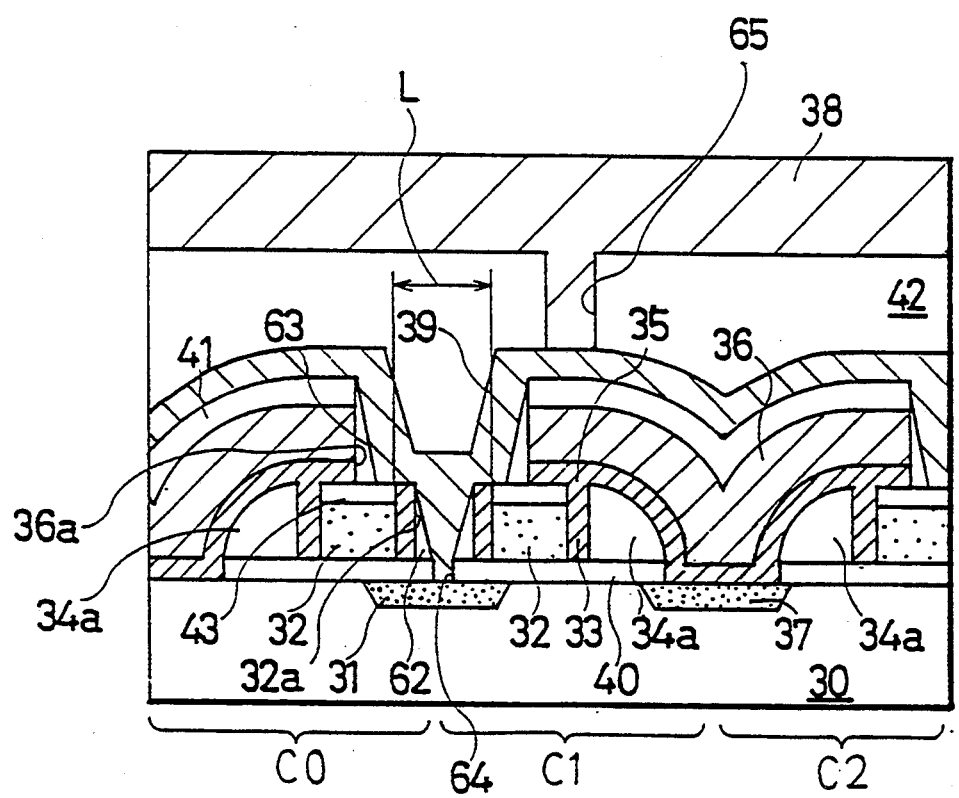
FIG. 1 is a cross-sectional view schematically showing a principle portion of an embodiment of the nonvolatile memory of the present invention.

In the memory cell of a nonvolatile memory according to the present invention, an auxiliary gate (AG) as a first electrode, a floating gate (FG), and a control gate (CG) as a second electrode are formed on a semiconductor substrate provided with a source composed of a first impurity diffused layer and a drain composed of a second impurity diffused layer. Memory Cells which are adjacent in the X direction have in common the source composed of the first impurity diffused layer and the drain composed of the second impurity layer. Memory cells which are adjacent in the Y direction have in common the auxiliary gate (AG) serving as the first electrode and the control gate (CG) serving as the second electrode.

In the nonvolatile memory of the present invention, it is preferred to use a silicon substrate as the semiconductor substrate. The silicon substrate has a $SiO_2$ film as a gate oxide film with the thickness of about 100 to 140 Å or a tunnel oxide film with the thickness of 50 to 100 Å thereon. On the oxide film, the first electrode is formed as the auxiliary gate. The material of the first electrode is not particularly limited, but polysilicon or polyside is preferred. The method of forming polysilicon or polyside is not limited in particular, and can be formed by conventional methods such as CVD. The preferred thickness of the WSix/poly Si film in this case is about 2000/1500 Å. On the first electrode, a $SiO_2$ film with the thickness of about 300 to 1000 Å can further be formed.

On one side wall of the first electrode is formed the floating gate (FG) in such a manner that the floating gate and the first electrode is separated by a sidewall spacer composed of an insulating film. The thickness of the sidewall spacer formed between the first electrode and the floating gate is preferably about 200 to 1000 Å. The sidewall spacer is preferably composed of, for example, a $SiO_2$ film or an ONO film consisting of $SiO_2$, SiN, and $SiO_2$ deposited in this order. These insulating films can also be formed by conventional methods such as CVD. The material of the floating gate is not particularly limited, but polysilicon is preferred. The formation of polysilicon can be conducted in accordance with conventional methods such as CVD. The preferred thickness of polysilicon in this case is about 3000 to 6000 Å.

On the entire surface of the first electrode formed $SiO_2$ film thereon and floating gate is deposited $SiO_2$ film or $SiO_2/SiN/SiO_2$ film (ONO film) as a first insulation film to the thickness of about 200 Å (as $SiO_2$ equivalent thickness). "The thickness of about 200 Å as $SiO_2$ equivalent thickness" means a thickness of ONO film corresponding to dielectric constant generated by a $SiO_2$ film with a thickness of 200 Å. In other words, an ONO film thickness which provides a dielectric constant equivalent to a $SiO_2$ film is 200 Å. The first insulating film has a control gate (CG) thereon which covers at least the floating gate. Preferably, it has a control gate (CG) thereon which covers the floating gate and a part of the first electrode (AG). The material of the control gate is not particularly limited, but polysilicon is preferred. The control gate can be formed by the same method as above.

On the first electrode and on the control gate is formed a conductive layer with an interlayer insulating film of $BPSG/SiO_2$, or the like interposed therebetween. The conductive layer may be formed as a source line to be connected to each first impurity diffused layer of memory cells which are adjacent in the X direction. The conductive layer can be formed as a pullout contact layer and then a source line can be formed on the pullout contact layer with the interlayer insulation film therebetween. In the latter case, the conductive layer is formed as a pullout contact layer individually in each source and each of pullout contact layer may be connected to the source line. The material of the conductive layer is not particularly limited, but polysilicon, for example, is preferred. The conductive layer is preferably formed by a conventional method to the thickness of about 2000 to 4000 Å. In this case, the end portion of the first electrode and the end portion of the control gate are preferably formed with a sidewall insulating film.

The nonvolatile memory of the present invention is formed with a first impurity diffused layer as the source and a second impurity diffused layer as the drain. The source/drain can be formed by a conventional method. For example, when a p-type semiconductor substrate is used, n-type impurities such as phosphorus and arsenic are introduced into the substrate by ion implantation at about $1 \times 10^{15}$ ions/cm$^2$. The first and second impurity diffused layers of a memory cell are arranged so as to be used in common by its adjacent memory cells.

In the nonvolatile memory of the present invention, the first electrode of a memory cell and the first electrode of its adjacent memory cell can be formed with a reduced spacing therebetween, so that the cell area can further be reduced irrespective of the alignment margin for forming the contact portion of the first impurity diffused layer. Moreover, since the second electrode is formed on the floating gate so as to cover the entire surface thereof, a higher capacity $R_{CC}$ can be obtained between the floating gate and the second electrode on the field of the floating gate irrespective of the area where the floating gate and the second electrode are overlapped, thereby reducing its cell area.

An embodiment of the non-volatile memory according to the present invention will be described below with reference to drawings.

EXAMPLE 1

As shown in FIG. 1, the memory cell C1 of the nonvolatile memory is formed on the silicon substrate 30 with the source 31 composed of the first impurity diffused layer and the drain 37 composed of the second impurity diffused layer. On the silicon substrate 30, the auxiliary gate (AG) 32 which functions as the first electrode and as a word line is formed with the gate oxide film 40 interposed therebetween. A spacer 33 composed of an ONO insulating film is formed on the side wall of the auxiliary gate 32 and further a floating gate (FG) 34a is formed with intermediation of the Spacer 33. On the floating gate (FG) 34a and on a part of the axiliary gate (AG) 32 is formed a control gate (CG) 36 as the second electrode with the insulating film 35 made of the same material as that of the spacer 33. On the control gate (CG) 36, the SiO₂ film 41 is formed as the second insulating film.

On the other side wall of the auxiliary gate 32 (the end portion 32a) is formed the sidewall insulating film 62 of SiO₂ with intermediation of the composed of an ONO film. A part of the gate oxide film 40 on the source 31 is opened to provide a contact hole 64 leading to the silicon substrate 30. On the silicon substrate 30 including the contact hole 64, the auxiliary gate (AG) 32 and the control gate (CG) 36 is formed a conductive pullout contact layer 39. On the pullout contact layer 39 is further formed the source line 38 with the interlayer insulating film 42 composed of an oxide film and BPSG deposited in this order therebetween. The interlayer insulating film 42 is formed with a contact hole 65 through which the source line 38 is connected to the pullout contact layer 39.

Alongside of the memory cell C1 are provided memory cells C2 and C0 in the X direction. The memory cells C1 and C0 have a single source 31 in common. The memory cells C1 and C2 have a single drain 37 in common. The sources 31 of the memory cells C1, C2, and C0, which are arranged in the X direction, are connected by the source line 38.

Figure 2:
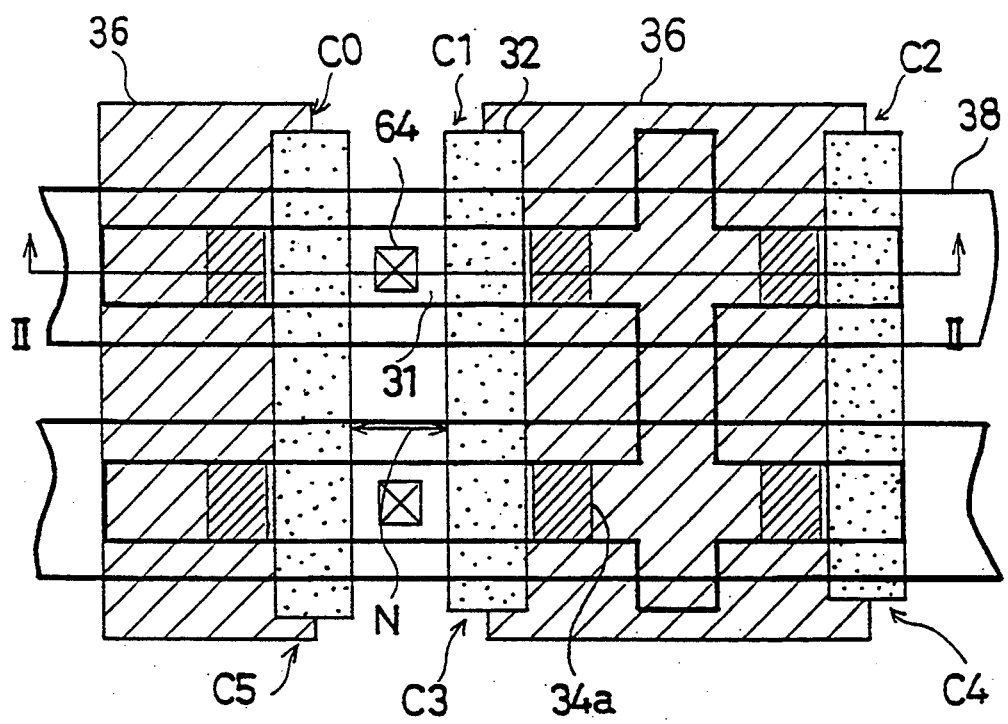
FIG. 2 is a plan view showing the principle portion of the nonvolatile memory of FIG. 1.

In the nonvolatile memory as shown in FIG. 2, memory cells C1, C2, and C0 and memory cells C3, C4, and C5 are arranged in two rows in the X direction, while the memory cells C1 and C3, memory cells C2 and C4, and memory cells C0 and C5 are arranged in three columns in the Y direction, so as to form a matrix. The auxiliary gates (AG) 32 of the memory cells C1 and C3 arranged in the Y direction of the matrix are connected in common in the Y direction.

The control gates (CG) 36 are connected in common in the Y direction of the matrix so as to cover the memory cells C1 and C2 and the memory cells C3 and C4, respectively.

EXAMPLE 2

Figure 3:
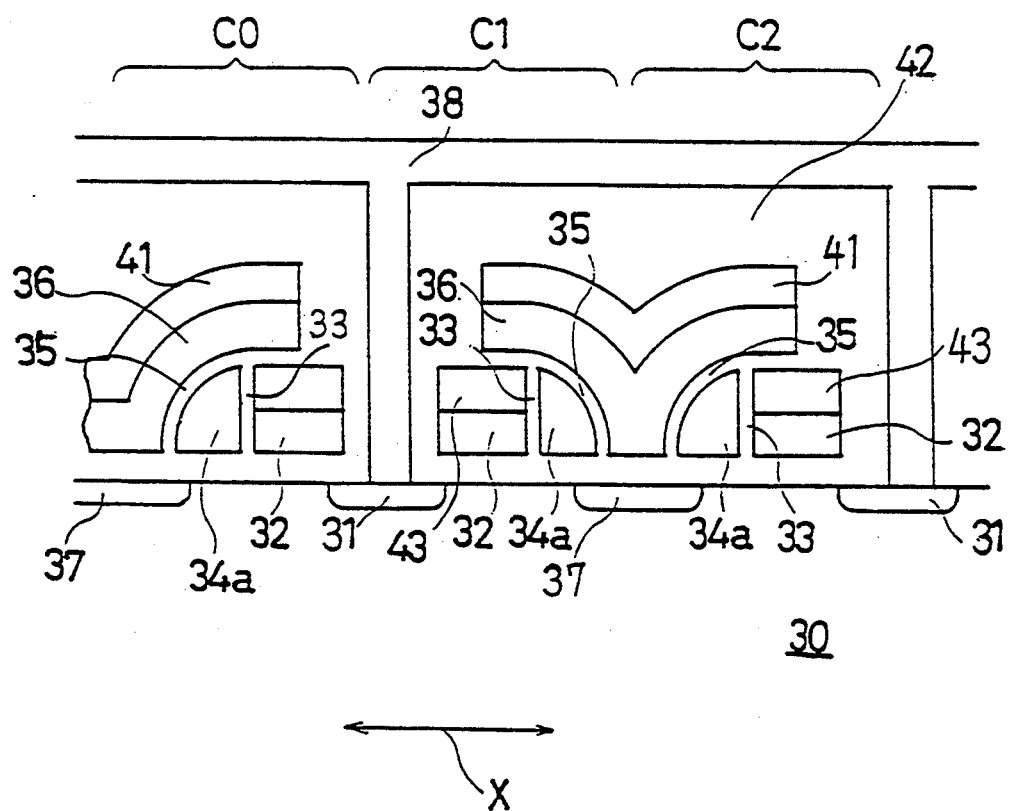
FIG. 3 is a cross-sectional view schematically showing the principle portion of another embodiment of the nonvolatile memory of the present invention.

As shown in FIG. 3, the auxiliary gate (AG) 32, the floating gate (FG) 34a, and the control gate (CG) 36 are similarly formed on the same silicon substrate as used in Example 1.

This example is substantially the same as Example 1, except that the source line is directly connected to the source without interposing the pullout contact layer therebetween.

EXAMPLE 3

Figure 4:
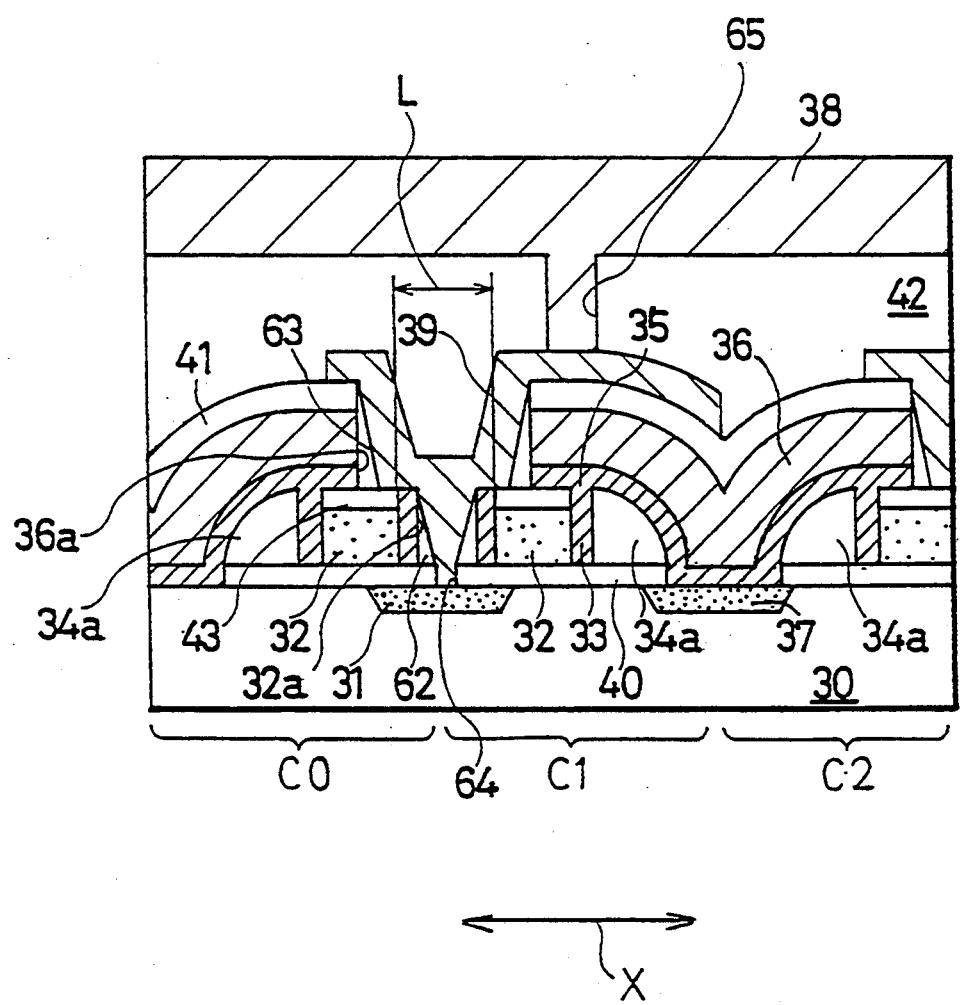
FIG. 4 is a cross-sectional view schematically showing the principle portion of still another embodiment of the nonvolatile memory of the present invention.

As shown in FIG. 4, this example is substantially the same as Example 1, except that the pullout contact layer 39 is formed individually in each source.

The method of fabricating the nonvolatile memory mentioned in Example 1 will be described.

Figure 5A:
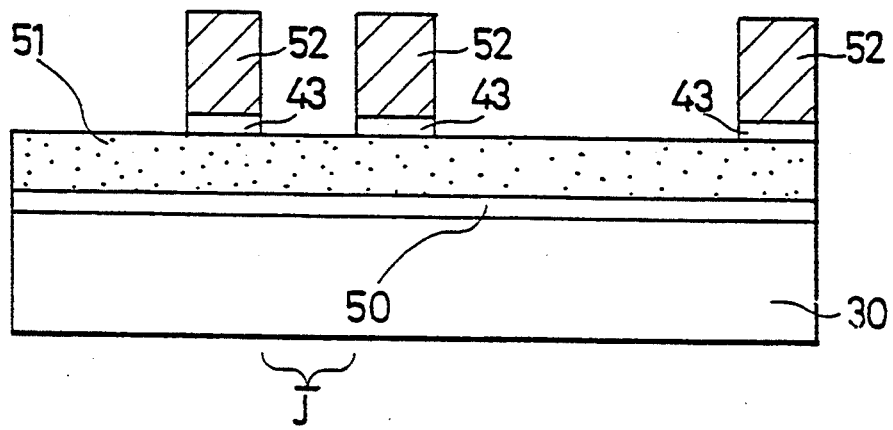

First, as shown in FIG. 5(a), the gate oxide film 50 is formed from SiO₂ to the thickness of about 140 Å on the silicon substrate 30. After polysilicon 51 and SiO₂ 43 are deposited on the gate oxide film 50 in this order, the SiO₂ film 43 is formed into a pattern by using a resist pattern 52 as the mask.

Figure 5B:
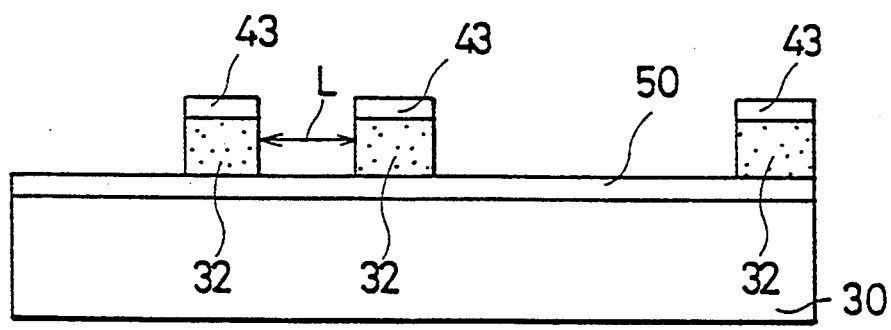

Next, as shown in FIG. 5(b), the resist pattern 52 is removed and then the polysilicon 51 is etched by using the SiO₂ film 43 as the mask, thus forming the auxiliary gate (AG) 32. In this case, the spacing L between the auxiliary gates (AG) 32 can be reduced to 0.8 μm or less. The spacing L in the present example is 0.6 μm.

Figure 5C:
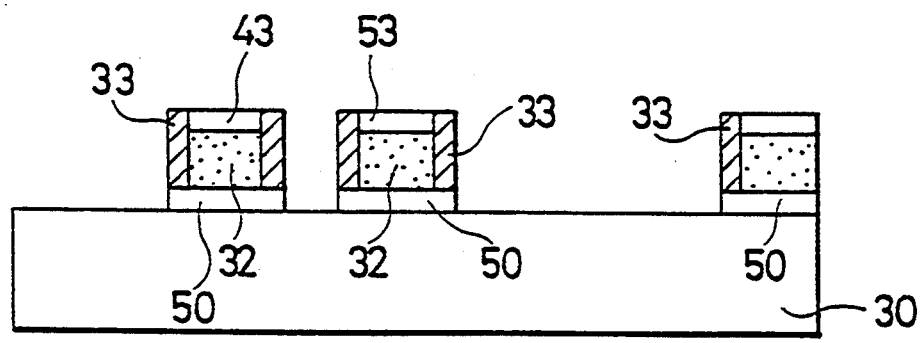

Subsequently, as shown in FIG. 5(c), a film of SiO₂ with the thickness of 150 Å, a film of SiN with the thickness of 350 Å and a film of SiO₂ or a SiO₂ film with the thickness of 400 Å are successively formed. The spacer 33 composed of an ONO film or a SiO₂ film is formed on the side wall of the auxiliary gate (AG) 32 by etching back at the same time as the silicon substrate 30 is exposed except for the region in which the auxiliary gate (AG) 32 and the spacer 33 are formed.

Figure 5D:
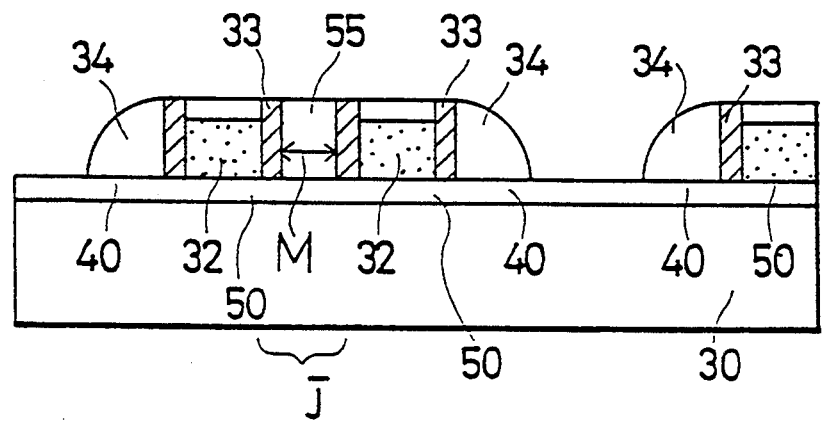

Thereafter, as shown in FIG. 5(d), the tunnel oxide film 40 is formed on the silicon substrate 30 by thermal oxidation. Then, a polysilicon layer with the thickness of 4000 Å is formed on the silicon substrate 30 including the auxiliary gate (AG) 32 and the spacer 33. Next, the sidewall 34 is formed from polysilicon by etching back on the side wall of each of the auxiliary gates (AG) 32 with the spacer 33 interposed therebetween. In this case, the region J in which the source is to be formed in the later step is buried with polysilicon 55 when the spacing M is less than two times thickness of polysilicon.

Figure 5E:
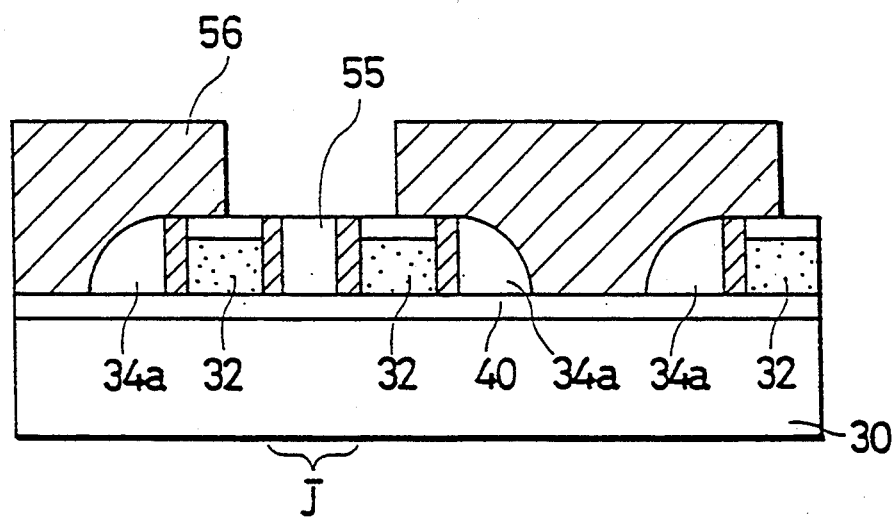

Subsequently, as shown in FIG. 5(e), the sidewall 34 of polysilicon is formed into a pattern resulting in the floating gate (FG) 34a. After that, the buried polysilicon 55 is removed by etching with the use of the resist pattern 56.

Figure 5F:
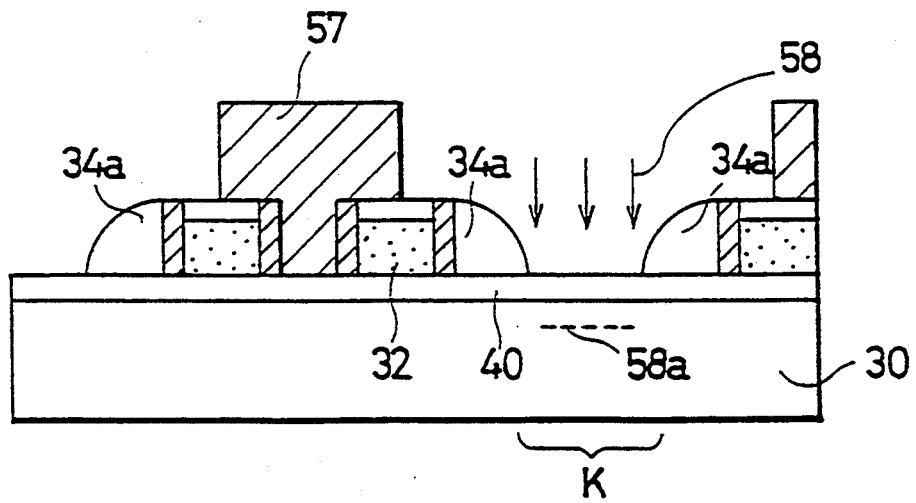

Furthermore, the resist pattern 56 is removed and then a resist pattern 57 is newly formed, as shown in FIG. 5(f). By using the resist pattern 57, the auxiliary gate (AG) 32, and the floating gate (FG) 34a as the mask, an impurity ion having the different type of charge than that of the silicon substrate 30, such as phosphorus or arsenic 58, is implanted at about $1 \times 10^{15}$ ions/cm² so as to form the impurity implanted layer 58a.

Subsequently, as shown in FIG. 5(g), the resist pattern 57 is removed and then an ONO film 59 with the thickness of about 200 Å (as SiO₂ equivalent thickness)

is formed on the silicon substrate 30 in the same manner as described above, so as to serve as the first insulating film. In this step, the impurity implanted layer 58a is simultaneously turned into the drain 37 by annealing.

Furthermore, as shown in FIG. 5(h), polysilicon is formed on the ONO film 59 and a SiO₂ film with the thickness of about 1000 Å is successively formed thereon so as to serve as the second insulating film. By using a resist pattern 60, the polysilicon is formed into a pattern to provide the control gate (CG) 36.

Figure 5I:
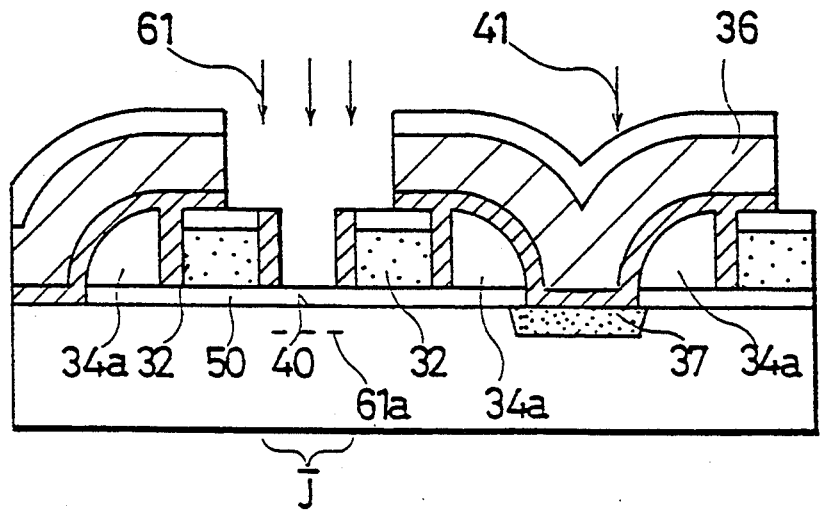
Figure 5J:
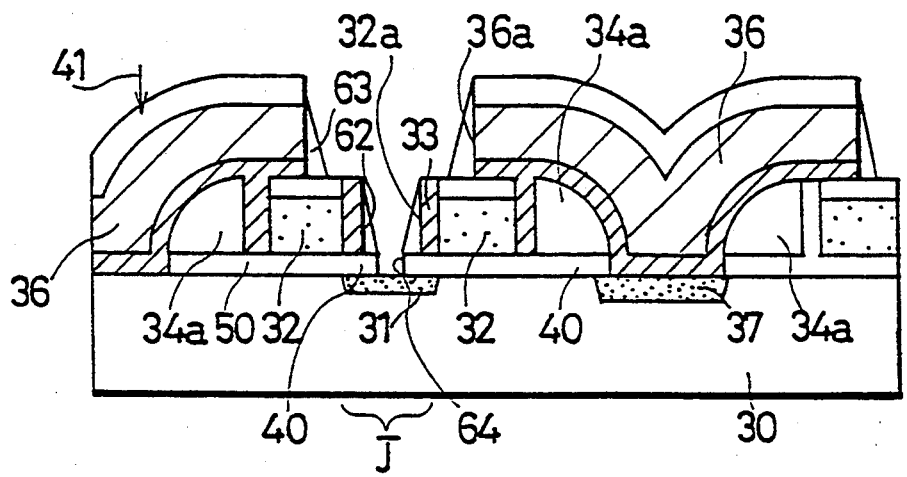

Next, as shown in FIG. 5(i), the resist pattern 60 is removed. Subsequently, by using the auxiliary gate (AG) 32 and the control gate (CG) 36 as the mask, phosphorus or aresenic ion 61 is implanted into the region J in which the source is to be formed in the same manner as described above, so as to form an impurity implanted layer 61a.

Subsequently, as shown in FIG. 5 (j), an SiO₂ film (not shown) is deposited and then the sidewall insulating films 62 and 63 are formed from SiO₂ by etch back on the end portion 32a of the auxiliary gate (AG) 32 and on the end portion 36a of the control gate (CG) 36, respectively. In this step, the impurity implanted layer 61a is simultaneously turned into the source 31 by annealing. The tunnel oxide film 40 on the source 31 is partially removed due to the etch back, thus forming the contact hole 64 leading to the surface of the silicon substrate 30.

Figure 5K:
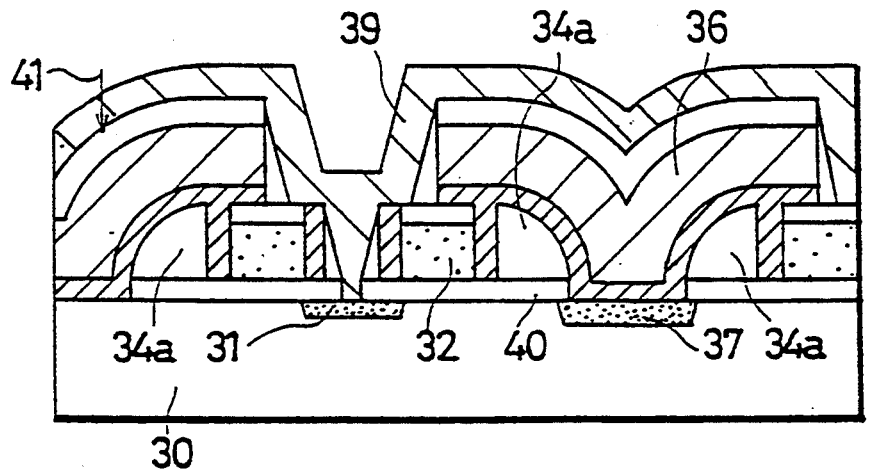

After a cleaning process with HF, a polysilicon layer with the thickness of about 4000 Å is formed on the silicon substrate 30 including the contact hole 64, the auxiliary gate (AG), and the control gate (CG) 36, as shown in FIG. 5(k). Thereafter, the polysilicon layer is etched by using the mask (not shown), so as to form the pullout contact layer 39.

Finally, after forming the interlayer insulating film 42 by depositing an oxide film and BPSG in this order on the pullout contact layer 39, the contact hole 65 is formed. On the interlayer insulating film 42 including the contact hole 65, the source line 38 (not shown) is formed by using, for example, Al.

Though the present example describes the case in which the pullout contact layer 39 is formed on the auxiliary gate (AG) and on the control gate (CG) 36 and then the pullout contact layer 39 is connected to the source line 38, a nonvolatile memory of like structure can be fabricated in a simpler production process in case that the source 31 is directly connected to the source line 38 without interposing the pullout contact layer 39 therebetween.

Thus, in the present example, the spacing L between the auxiliary gates (AG) 32 of FIG. 2 can be reduced to 0.6 μm.

Next, the method of reading data from the nonvolatile memory thus formed will be described.

Figure 6:
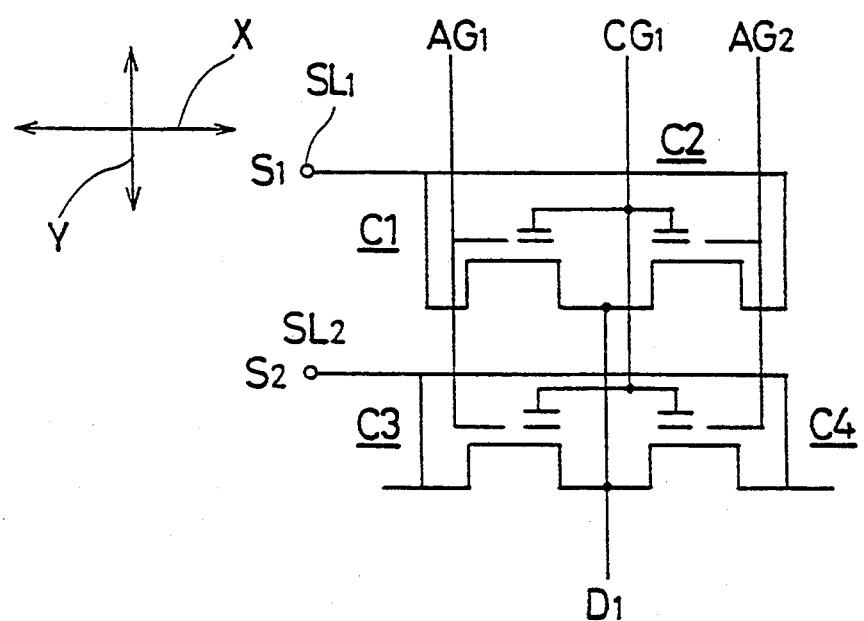
FIG. 6 is an equivalent circuit diagram of the nonvolatile memory of the present invention.

An equivalent circuit of the nonvolatile memory constituted as above is shown in FIG. 6. By applying voltage to the nonvolatile memory as shown in Table 1, writing, erasing, and reading of data can be performed.

TABLE 1

|  | $S_1$ | $S_2$ | $D_1$ | $AG_1$ | $AG_2$ | $CG_1$ |
|---|---|---|---|---|---|---|
| WRITING | 0 | $V_{cc}$ | $V_{cc}$ | $V_t$ | 0 | $V_{pw}$ |
| ERASING | float | float | $V_{cc}$ | float | float | $-V_{pe}$ |
| READING | 0 | $V_{cc}$ | $V_{D.READ}$ | $V_{cc}$ | 0 | $V_{cc}$ |

If data is to be read form the memory cell C1 in the equivalent circuit of FIG. 6, CG₁ is first put in the high state. Then AG₁ and D₁ (drain line) are supplied with voltage to be put in the high state, with the result that AG₁, CG₁, and D₁ of the memory cell C3 are simultaneously supplied with voltage. The same potential as applied to AG₁, CG₁, and D₁ is also applied to S₂ (source line). Hence there is no possibility that a leakage current will flow through the memory cell C3, even when the memory cell C3 is in the over-ease state, for the source and drain of the memory cell C3 are set at the same potential.

Figure 7:
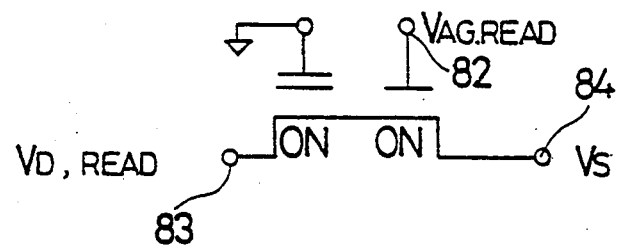
FIG. 7 is another equivalent circuit diagram for illustrating the operation of the nonvolatile memory of the present invention.

That is, if data is to be read from the selected memory cell C1 in FIG. 6, an unselected memory cell C3 is arranged so that the source 84 and the drain 83 are at the same potential ($V_s = V_{D.READ}$) even when the auxiliary gate (AG) and the control gate (CG) are turned on by the application of voltage, as shown in FIG. 7. Consequently, it is possible to prevent a leakage current from flowing through an unselected memory cell which is in the same word line as the selected memory cell and which is in the over-ease state.

Figure 8:
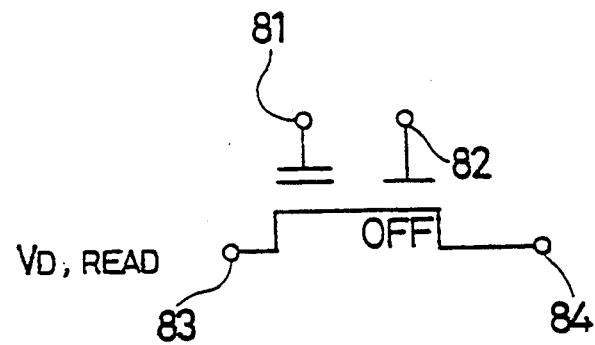
FIG. 8 is still another equivalent circuit diagram for illustrating the operation of the nonvolatile memory of the present invention.
Figure 9:
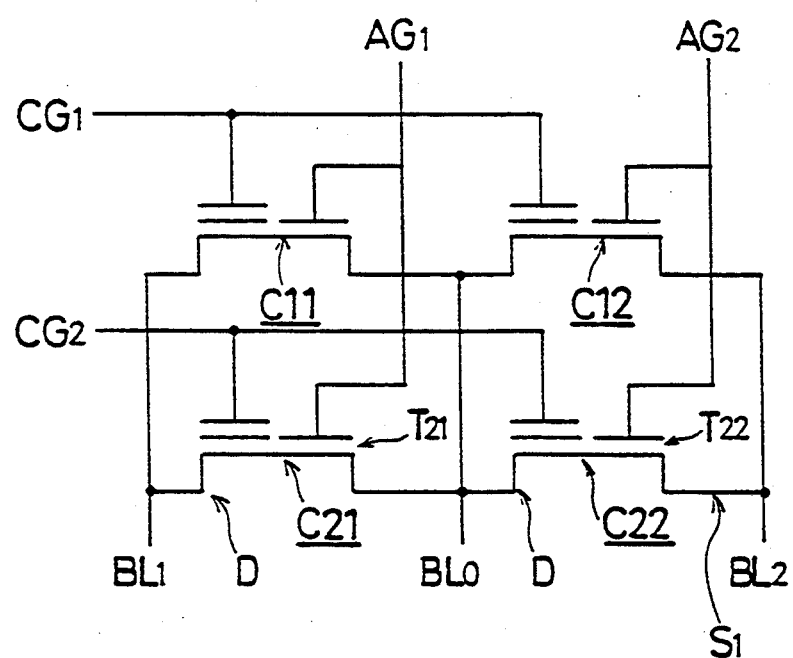
FIG. 9 is an equivalent circuit diagram of a conventional nonvolatile memory.
Figure 10:
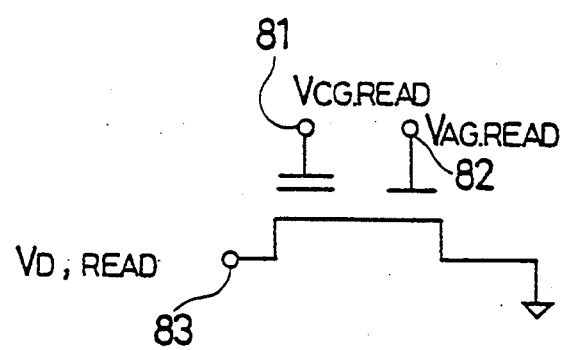
FIG. 10 is another equivalent circuit diagram for illustrating the operation of the conventional nonvolatile memory.
Figure 11:
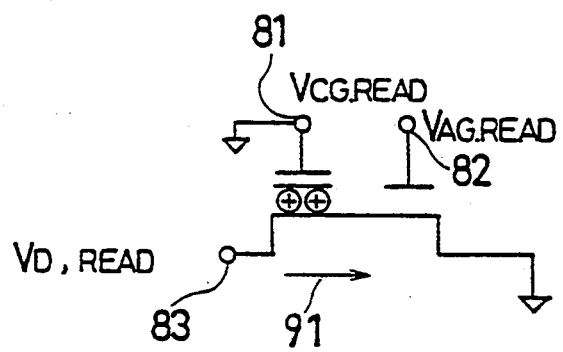
FIG. 11 is still another equivalent circuit diagram for illustrating the operation of the conventional nonvolatile memory.

By setting the potential of the auxiliary gate (AG) at zero ($V_{AG}=0$), the AG transistor for the unselected memory cell C2 of FIG. 6 is constantly in the off state even when voltage is applied to the drain D1, as shown in FIG. 8.

As described above, according to the present invention, it is possible to prevent leakage current from flowing through an unselected memory which is in the same word line as the selected cell and which is in the state of over erase when data is read from the selected memory cell.

Moreover, since the floating gate 34a as the sidewall spacer is formed by self-alignment on the side of the first electrode 32 but is not self-aligned with respect to the control gate 36, it is covered with the control gate 36, which results in higher $R_{CC}$, thereby providing the nonvolatile memory suitable for low-voltage operation.

What is claimed is:

1. A nonvolatile memory including a plurality of memory cells comprising:

a semiconductor substrate provided with a first impurity diffused layer and a second impurity diffused layer;

a first electrode formed over the semiconductor substrate;

a floating gate formed adjacent the side wall of the first electrode, the floating gate and the first electrode being separated by a sidewall spacer; and a second electrode overlaying at least the floating gate, the second electrode and the floating gate being separated by a spacer, wherein the said memory cells are arranged in X and Y directions to form a matrix;

the first electrodes of memory cells which are arranged in the Y direction are connected in common in the Y direction, while the second electrodes thereof are connected in common in the Y direction;

a memory cell and one of its adjacent memory cells which are arranged in the X direction have a first impurity diffused layer in common;

the said memory cell and the other adjacent memory cell thereof have a second impurity diffused layer in common; and the said first impurity diffused layers of the memory cells arranged in the X direction are further connected by a conductive layer.

2. A nonvolatile memory of claim 1 wherein said first impurity diffused layers of the memory cells arranged in the X direction are connected by a conductive layer with a pullout contact layer.

3. A nonvolatile memory of claim 1 wherein said first diffused layers of the memory cells arranged in the X direction are connected by a conductive layer with a pullout contact layer, the pullout contact layer being formed individually on each of the first impurity diffused layers.

4. A nonvolatile memory of claim 1 wherein said second electrode extends over the second impurity diffusion layer and the floating gate, the second impurity diffusion layer being shared by two adjacent memory cells which are arranged in the X direction.

5. A nonvolatile memory including a plurality of memory cells formed as a matrix on a substrate, each memory cell comprising:
a source region formed in the substrate;
a drain region formed in the substrate;
an auxiliary gate formed over the substrate;
a floating gate formed over the substrate;
a control gate formed over at least a portion of the auxiliary gate and over at least a portion of the floating gate;
wherein two adjacent memory cells in an X direction share a common source region or a common drain region; and
wherein two adjacent memory cells in a Y direction share a common auxiliary gate and a common control gate.

6. A nonvolatile memory of claim 5 wherein the auxiliary gate and the floating gate are separated by an insulating film.

7. A nonvolatile memory of claim 5 wherein the floating gate and the control gate are separated by an insulating film.

8. A nonvolatile memory of claim 5 wherein the source region is connected to a conductive layer with a pullout contact layer.

9. A nonvolatile memory of claim 5 wherein the source region of the memory cells arranged in the X direction are connected to a conductive layer with a pullout contact layer, the pullout contact layer being formed individually on each of the source regions.

10. A nonvolatile memory of claim 5 wherein the control gate entirely covers the floating gate.

11. A nonvolatile memory of claim 5 wherein a distance separating auxiliary gates of adjacent cells in an X direction is 0.6 μm.

12. A nonvolatile memory of claim 4 wherein said second electrode extends over the second impurity diffusion layer and the floating gates of two adjacent memory cells which are adjacent in the X direction.

* * * * *